United States Patent
Adkisson et al.

(10) Patent No.: US 7,098,067 B2
(45) Date of Patent: Aug. 29, 2006

(54) MASKED SIDEWALL IMPLANT FOR IMAGE SENSOR

(75) Inventors: James W. Adkisson, Jericho, VT (US); Mark D. Jaffe, Shelburne, VT (US); Arthur P. Johnson, Essex Junction, VT (US); Robert K. Leidy, Burlington, VT (US); Jeffrey C. Maling, Grand Isle, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/905,043

(22) Filed: Dec. 13, 2004

(65) Prior Publication Data

US 2006/0128126 A1  Jun. 15, 2006

(51) Int. Cl.
*H01L 21/00* (2006.01)

(52) U.S. Cl. .................. 438/75; 257/E27.133

(58) Field of Classification Search .............. 438/48, 438/57, 60, 73, 75, 144, 142, 197–201, 230, 438/232, 237, 328, 296, 304, 424–426, FOR. 415, 438/44, 45; 257/E27.133, E27.046, E27.108, 257/E27.13, E27.131, E27.132, 462, 466
See application file for complete search history.

(56) References Cited

U.S. PATENT DOCUMENTS

| | | | |
|---|---|---|---|
| 5,516,711 A | 5/1996 | Wang | |
| 6,372,603 B1 * | 4/2002 | Yaung et al. | 438/424 |
| 6,500,692 B1 | 12/2002 | Rhodes | |
| 6,509,221 B1 | 1/2003 | Doris et al. | |
| 6,551,910 B1 | 4/2003 | Ohashi | |
| 6,611,037 B1 | 8/2003 | Rhodes | |
| 6,730,980 B1 | 5/2004 | Rhodes | |
| 6,767,759 B1 | 7/2004 | Rhodes | |
| 2004/0094784 A1 | 5/2004 | Rhodes et al. | |
| 2004/0178430 A1 | 9/2004 | Rhodes et al. | |
| 2004/0195600 A1 * | 10/2004 | Rhodes | 257/292 |
| 2005/0001248 A1 | 1/2005 | Rhodes | |
| 2005/0067640 A1 | 3/2005 | Ohkawa | |
| 2005/0088556 A1 | 4/2005 | Han | |
| 2005/0093038 A1 | 5/2005 | Rhodes | |

FOREIGN PATENT DOCUMENTS

| | | |
|---|---|---|
| JP | 08-335690 | 12/1996 |
| JP | 09-223787 | 8/1997 |

* cited by examiner

*Primary Examiner*—Brook Kebede
(74) *Attorney, Agent, or Firm*—Scully, Scott, Murphy & Presser, P.C.; Anthony J. Canale

(57) ABSTRACT

A novel image sensor structure formed on a substrate of a first conductivity type includes a photosensitive device of a second conductivity type and a surface pinning layer of the first conductivity type. A trench isolation region is formed adjacent to the photosensitive device pinning layer. The structure includes a dopant region comprising material of the first conductivity type formed along a sidewall of the isolation region that is adapted to electrically couple the pinning layer to the substrate. The corresponding method facilitates an angled ion implantation of dopant material in the isolation region sidewall by first fabricating the photoresist layer and reducing its size by removing a corner, or a corner portion thereof, which may block the angled implant material. To facilitate the angled implant to the sidewall edge past resist block masks, two methods are proposed: 1) a spacer type etch of the imaged photoresist; or, 2) a corner sputter process of the imaged photoresist.

10 Claims, 4 Drawing Sheets

MASKED SIDEWALL IMPLANT FOR IMAGE SENSOR

CROSS REFERENCE TO RELATED APPLICATIONS

The present invention is related to commonly-owned, co-pending U.S. patent application Ser. No. 10/904,896 (BUR920040218US1) entitled A PREDOPED TRANSFER GATE FOR AN IMAGE SENSOR and (BUR920040222US1) entitled A RECESSED GATE FOR AN IMAGE SENSOR, the whole contents and disclosure of each of which is incorporated by reference as if fully set forth herein.

FIELD OF THE INVENTION

The present invention relates generally to the fabrication of semiconductor pixel imager arrays, and more particularly, to a novel Active Pixel Sensor (APS) cell structure including a masked sidewall implant and process therefor.

BACKGROUND OF THE INVENTION

CMOS image sensors are beginning to replace conventional CCD sensors for applications requiring image pick-up such as digital cameras, cellular phones, PDA (personal digital assistant), personal computers, and the like. Advantageously, CMOS image sensors are fabricated by applying present CMOS fabricating process for semiconductor devices such as photodiodes or the like, at low costs. Furthermore, CMOS image sensors can be operated by a single power supply so that the power consumption for that can be restrained lower than that of CCD sensors, and further, CMOS logic circuits and like logic processing devices are easily integrated in the sensor chip and therefore the CMOS image sensors can be miniaturized.

Current CMOS image sensors comprise an array of CMOS Active Pixel Sensor (APS) cells, which are used to collect light energy and convert it into readable electrical signals. Each APS cell comprises a photosensitive element, such as a photodiode, photogate, or photoconductor overlying a doped region of a substrate for accumulating photogenerated charge in an underlying portion thereof. A readout circuit is connected to each pixel cell and often includes a diffusion region for receiving charge from the photosensitive element, when read-out. Typically, this is accomplished by a transistor device having a gate electrically connected to the floating diffusion region. The imager may also include a transistor, having a transfer gate, for transferring charge from the photosensitive element across a surface channel to the floating diffusion region, and a transistor for resetting the floating diffusion region to a predetermined charge level prior to charge transfer.

As shown in FIG. 1, a typical CMOS APS cell 10 includes a pinned photodiode 20 having a pinning layer 18 doped p+-type and, an underlying lightly doped n-type region 17. Typically, the pinned diode 20 is formed on top of a p-type substrate 15 or a p-type epitaxial layer or p-well surface layer having a lower p-type concentration than the diode pinning layer 18. As known, the surface pinning layer 18 is in electrical contact with the substrate 15 (or p-type epitaxial layer or p-well surface layer). The photodiode 20 thus has two p-type regions 18 and 15 having a same potential so that the n-type doped region 17 is fully depleted at a pinning voltage (Vp). That is, the surface pinning layer 18 is in electrical contact to the substrate. The pinned photodiode is termed "pinned" because the potential in the photodiode is pinned to a constant value, Vp, when the photodiode is fully depleted.

As further shown in FIG. 1, the n-type doped region 17 and p+ region 18 of the photodiode 20 are spaced between an isolation region, e.g., a shallow trench isolation (STI) region 40, and a charge transfer transistor gate 25 which is surrounded by thin spacer structures 23a,b. The shallow trench isolation (STI) region 40 is located proximate the pixel image cell for isolating the cell from an adjacent pixel cell. In operation, light coming from the pixel is focused down onto the photodiode through the diode where electrons collect at the n-type region 17. When the transfer gate 25 is operated, i.e., turned on by applying a voltage to the transfer gate 70 comprising, for example, an n-type doped polysilicon layer 70, the photo-generated charge 24 is transferred from the charge accumulating doped n-type doped region 17 via a transfer device surface channel 16 to a floating diffusion region 30, e.g., doped n+ type.

As mentioned, in each pixel image cell, the surface pinning layer 18 is in electrical contact to the substrate 15 of the same conductivity type. Currently, the surface pinning layer (e.g., p-type doped) of the CMOS image sensor collection diode is connected to the substrate via a well implant structure 150 (e.g., doped p-type) located on one of the edges of the collection diode 20. In practice, the underlying substrate well structure 150 is created by a mask implant technique, as are the photodiode and pinning layer structures and each are formed in separate processing steps. As a mask implant is used to form the p-well, there is a resulting alignment tolerance associated with the p-well 150 and connecting pinning layer 18. This tolerance is depicted by the double-sided arrow shown in FIG. 1 and results in potentially misalignment of the connection leading to collection diode device performance deficiencies such as current leakage.

It would thus be highly desirable to avoid the connection misalignment issues that potentially exist between the underlying substrate well structure and the surface pinning layer of the collection well diode.

SUMMARY OF THE INVENTION

It is thus an object of the present invention to provide a novel structure and method of forming an imaging device cell structure that ensures a proper electrical connection between the surface pinning layer of the collection well device and the underlying substrate.

It is a further object of the present invention to provide an imaging sensor device APS cell structure that includes an adjacent isolation (STI) structure including a sidewall edge and that is provided with a novel sidewall implant region for ensuring improved alignment of conductive material and proper electrical contact between the surface pinning layer above the collection well device and the underlying substrate.

It is a further object of the present invention to provide an implant doping technique in a method for manufacturing an image sensor APS cell including an adjacent isolation STI structure that replaces the underlying well implant with an implant into the sidewall of the STI region to ensure improved alignment of conductive material and proper electrical contact between the surface pinning layer above the collection well device and the underlying substrate.

This invention particularly addresses an image sensor and a method of fabrication that includes an improved technique for providing an electrical connection between a surface pinning layer of the collection well device and a well structure of the underlying substrate. In the novel process, the profile of a patterned photoresist layer formed above a device region adjacent a formed STI trench is tailored to effectively enable angled implant doping of material in the adjacent isolation region sidewall. This method thus includes fabricating the photoresist layer and removing a corner, or a corner portion thereof, which blocks the angled implant material. To facilitate the angled implant to the sidewall edge past resist block masks, two methods are proposed: 1) performing a spacer type etch of the imaged photoresist; or, 2) perform a corner sputter process of the imaged photoresist. Either process allows for improved groundrules by lowering the photoresist and removing the corner that blocks the angled material.

Thus, according to one aspect of the invention, there is provided an active pixel sensor (APS) cell structure comprising: a substrate of a first conductivity type; a collection well layer of a second conductivity type formed below a substrate surface; a pinning layer of the first conductivity type formed atop the collection well layer at the substrate surface, and an isolation region formed adjacent to the pinning layer and collection well layer; and a dopant region comprising material of the first conductivity type formed along a sidewall of the isolation region, wherein the dopant region electrically couples the pinning layer to the substrate.

According to a second aspect of the invention, there is provided a method for forming an active pixel sensor (APS) cell structure comprising the steps of:
a) providing a substrate of a first conductivity type;
b) forming a trench isolation proximate the location of an adjacent photosensitive device having a surface pinning layer of said first conductivity type;
c) forming a photoresist layer patterned atop a substrate surface to expose a sidewall portion of said isolation trench;
d) tailoring the size of said patterned photoresist layer to facilitate ion implanting of dopant material in said exposed sidewall portion; and,
e) forming a dopant region comprising implanted dopant material of the first conductivity type along said exposed isolation trench sidewall portion adapted for electrically coupling a formed pinning layer to the substrate.

In one embodiment, a spacer-type etch process is implemented to reduce the size and/or tailor a surface profile of the patterned photoresist layer by rounding a corner portion of the patterned photoresist layer.

In another embodiment, a sputter-type etch process is implemented to reduce the size and/or tailor a surface profile of the patterned photoresist layer by removing a corner portion of the patterned photoresist layer.

Advantageously, providing the electrical coupling between the surface pinning layer of the collection well device and the underlying substrate formed according to the method of the invention obviates the alignment tolerance, enabling larger collection diodes and increased optical efficiencies.

BRIEF DESCRIPTION OF THE DRAWINGS

The objects, features and advantages of the present invention will become apparent to one skilled in the art, in view of the foiling detailed description taken in combination with the attached drawings, in which.

DETAILED DESCRIPTION OF THE PREFERRED EMBODIMENTS

According to one aspect of the invention, there is provided an improved implant doping technique in a method for manufacturing an imaging device APS cell that ensures proper electrical connection between the surface pinning layer of the collection well device and the underlying substrate.

Figure 1:
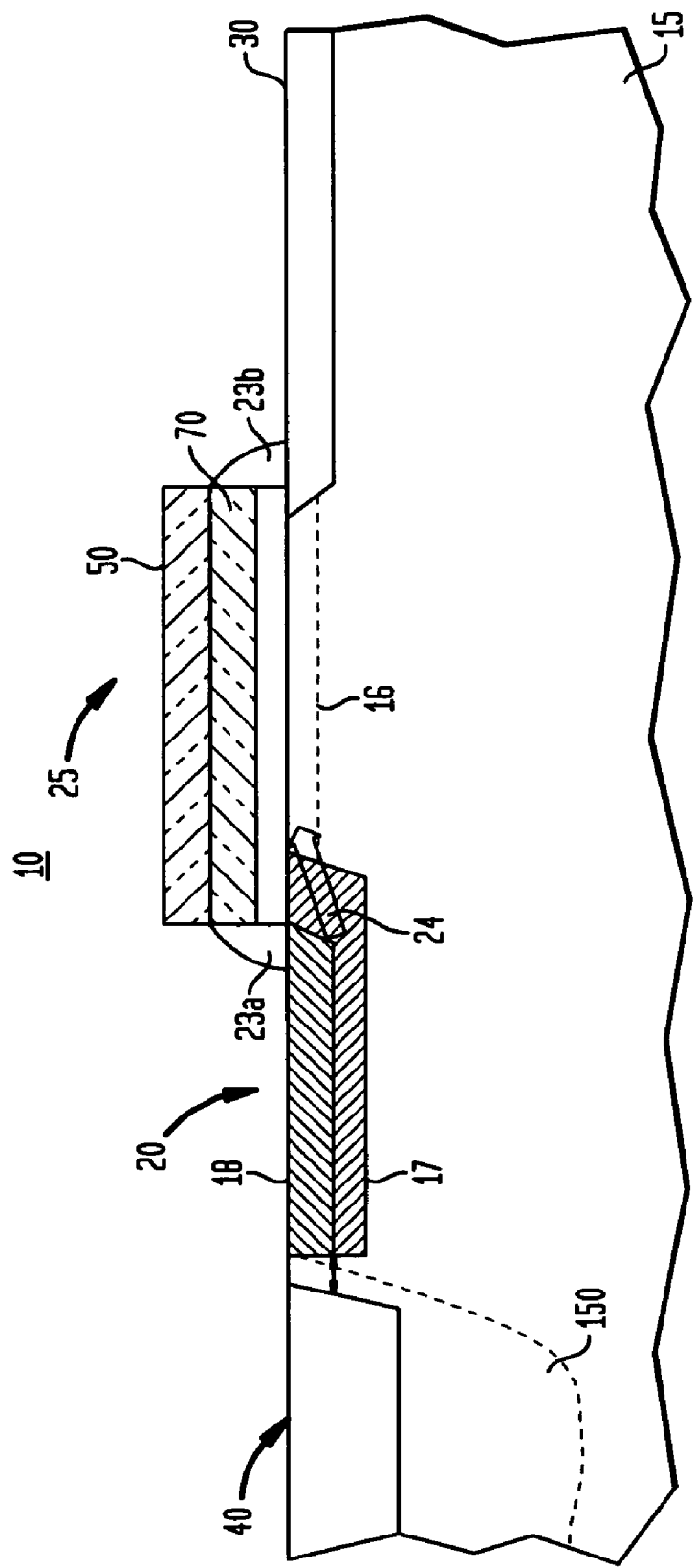
FIG. 1 depicts a CMOS APS cell 10 including a pinned photodiode 20 according to the prior art.
Figure 2:
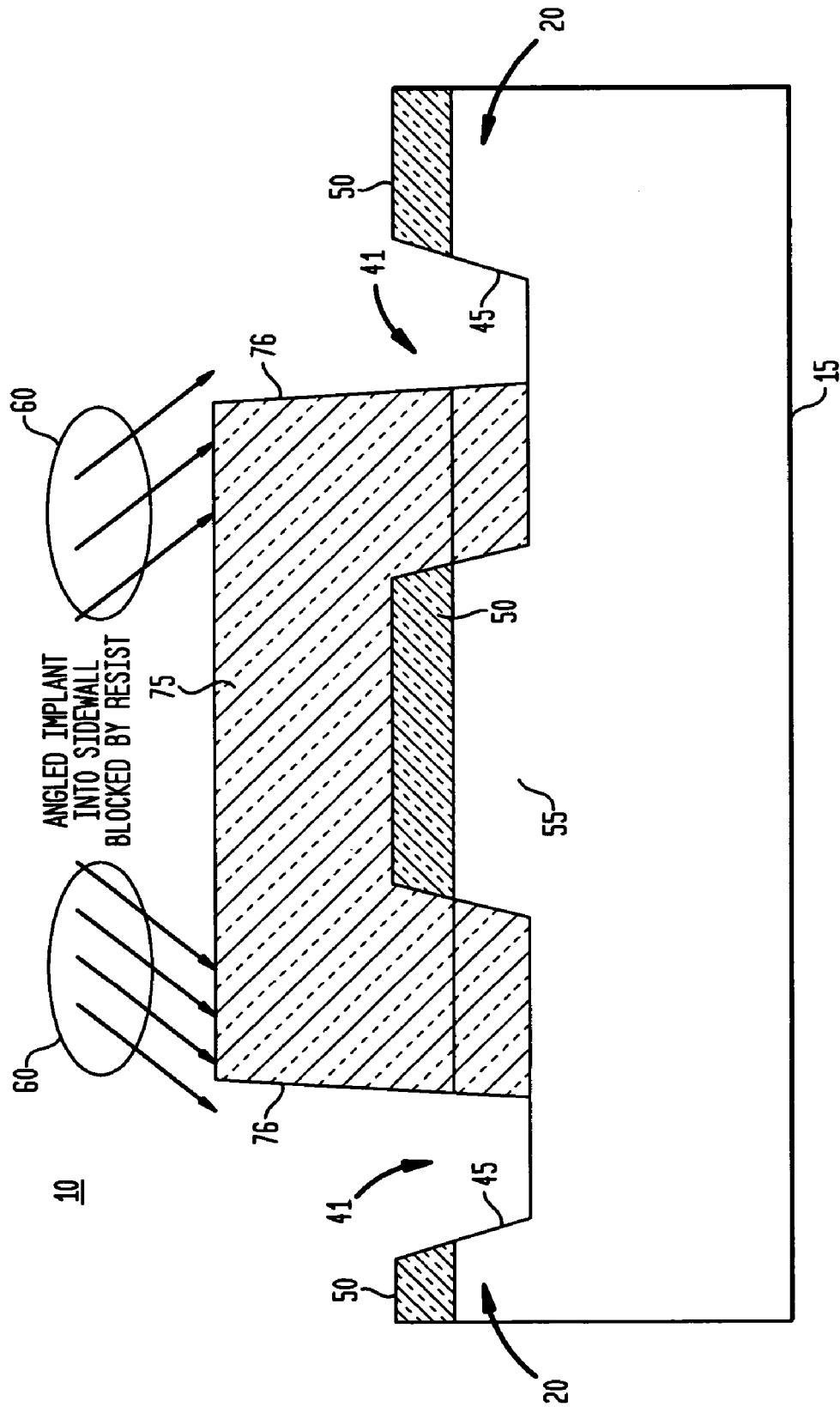
FIG. 2 depicts, through a cross-sectional view, an APS cell manufacturing step whereby block masks are applied and an angled implant is performed to dope a sidewall edge of an adjacent STI trench region associated with the APS cell 10 having a pinned photodiode 20 of FIG. 1.

As shown in FIG. 2, there is provided a novel method in an APS cell manufacturing process that includes the application of block masks to perform an angled implant into a sidewall edge 45 of an adjacent formed STI trench region 41 associated with the APS cell 10 having a pinned photodiode 20. As will be explained in greater detail, a sidewall implant of the STI ensures that the eventual formed surface pinning layer of the pinned photodiode 20 is in electrical contact with the underlying substrate 15. In the process of forming the APS cell structure 10 of FIG. 2, STI trench regions 41 are first formed in a bulk semiconductor substrate including, for example, Si, SiGe, SiC, SiGeC, GaAs, InP, InAs and other semiconductors, or layered semiconductors such as silicon-on-insulators (SOI), SiC-on-insulator (SiCOI) or silicon germanium-on-insulators (SGOI). For purposes of description, substrate 15 is a Si-containing semiconductor substrate of a first conductivity type, e.g., lightly doped with p-type dopant material such as boron or indium (beryllium or magnesium for a III-V semiconductor), to a standard concentration ranging between, for example, $1\times10^{14}$ to $1\times10^{16}$ cm$^{-3}$. Then, using standard processing techniques, one or more STI trench recesses 41 having sidewall edges 45 are formed in the substrate 15. That is, utilizing a trench lithography, a sacrificial nitride mask 50 is applied, patterned and developed to expose open regions 41 for forming STI trenches. Subsequently, an STI etch process is performed to result in etched STI opening 41. As shown in FIG. 2, adjacent each etched STI opening 41 formed in the substrate, there is depicted the locations where a pinned photodiode 20 is to be formed.

To get the surface pinning layer of the formed pinned photodiode 20 to be in electrical contact with the underlying substrate 15, a sidewall implant in the STI trenches are performed prior to filling the trenches with STI dielectric material. As shown in FIG. 2, on top of the formed sacrificial nitride mask 50 above a device region 55 at the substrate surface where imager support devices are subsequently formed, a photoresist mask 75 is then patterned having edges 76. Then, an angled implant 60 is then performed to deposit dopant material into the sidewall 45 of the STI opening. Assuming a p-type doped substrate, preferred STI sidewall implant dopant materials includes p-type dopants, such as Boron or Indium. As shown in FIG. 2, to ensure proper dopant implant concentrations for forming the eventual electrical contact between the surface pinning layer 18 with the underlying substrate 15, it is understood that the height and spacing of the implant resist 75 is critical. However, as shown in FIG. 2, the patterned photoresist layer 75 needs to be fairly thick to handle the topography driven by the STI 40 thus effecting its height as well as it's proximity to the STI sidewall edge 45. As a result, the formed photoresist layer 75 may tend to block the angled implant 60 from reaching the sidewall edge 45 in the manner as desired.

Figure 3:
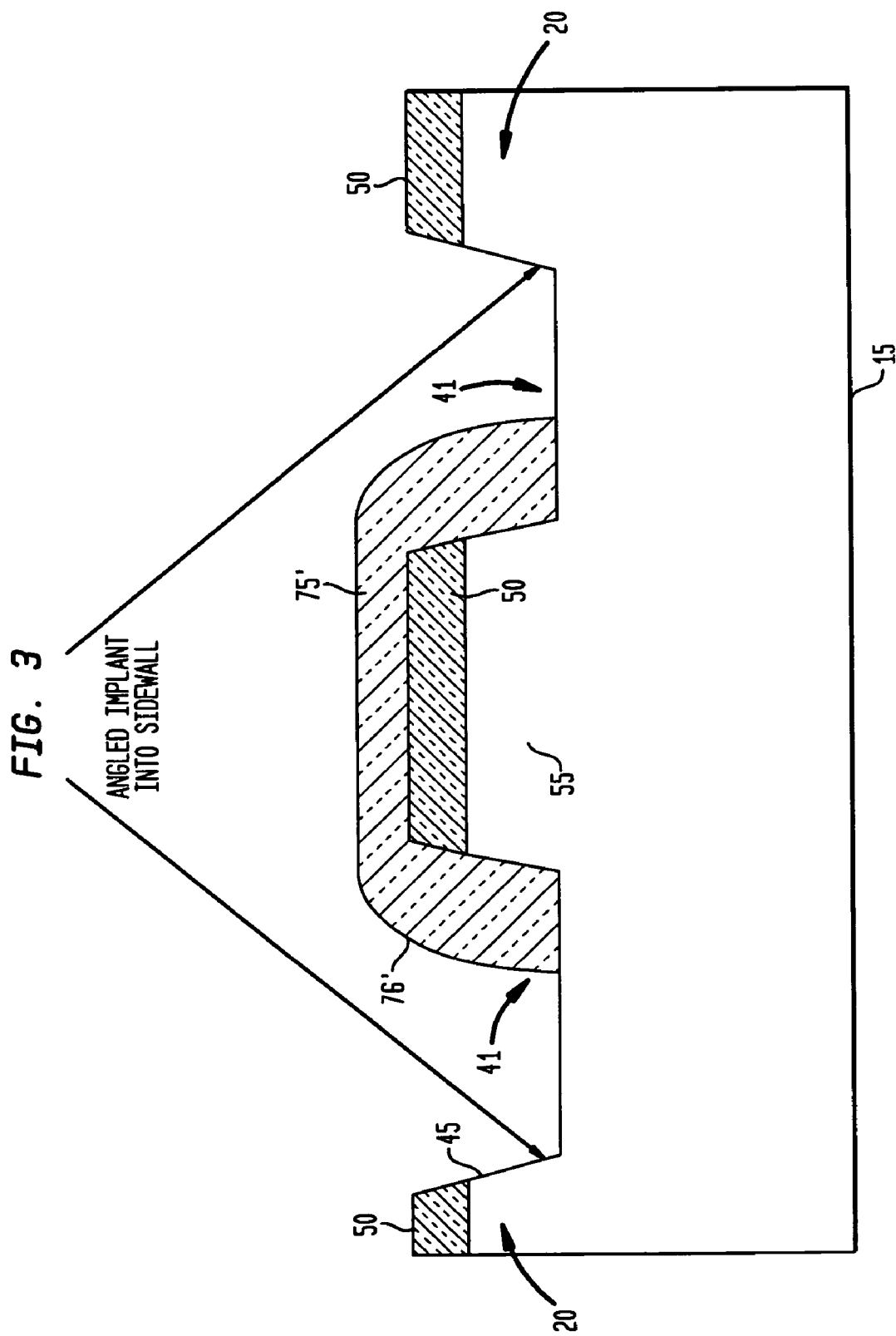
FIG. 3 illustrates, through a cross-sectional view, the resulting photoresist layer structure 75' patterned and etched according to the invention to allow for a desired angled implanted in a sidewall edge of an adjacent STI region.

In order to avoid this, according to one aspect of the invention as shown in FIG. 3, an etch process may be performed to tailor the topography of the photoresist layer 75 to result in the photoresist layer 75' of reduced size as shown in FIG. 3.

Figure 4:
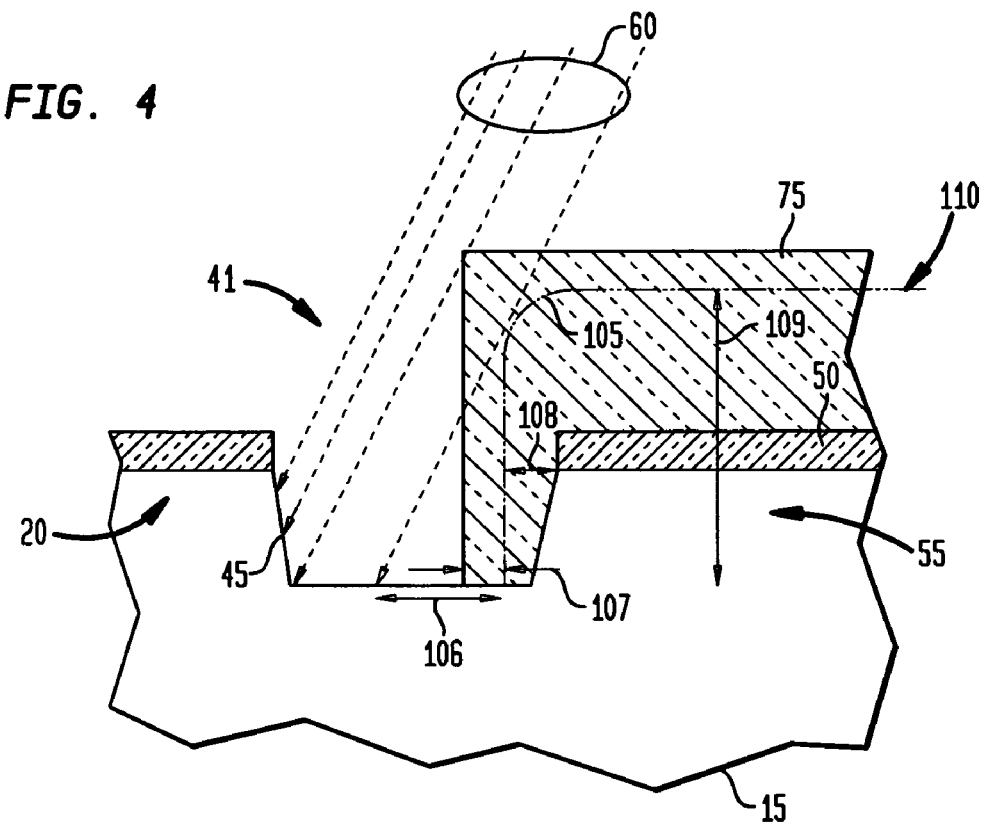
FIG. 4 depicts, through a cross-sectional view, a detailed spacer etch-type process performed in accordance with the invention to result in a rounded corner resist pattern as depicted in FIG. 3; and, FIG. 5 depicts, through a cross-sectional view, an alternative sputter etch-type process performed in accordance with the invention to result in an angled corner resist pattern.

As shown in FIGS. 3 and 4, according to a first etch technique, a spacer type etch is implemented to pull down the imaged material and round off the corner edges simultaneously by having a vertical and horizontal etch component so the corner is attacked from both directions. FIG. 4 particularly depicts a spacer type etch that comprises a directional or anisotropic process, which can be purely physical (e.g., a sputter etch) or have a chemical component (e.g., reactive ion etch or RIE). In either case, the etch process is selected to include a vertical etch component for etching the patterned photoresist layer 75 to result in a desired resist layer height 109 as depicted in FIG. 4 and, include a horizontal or lateral etch component at the bottom 107 and at the top of the Si region 108 (e.g., at the Nitride/Oxide interface) to result in a photoresist pattern structure 75' having a profile 110 shown in FIG. 4 with a rounded corner 105.

An alternative method for etching the photoresist mask 75 in FIG. 2 is to provide a sputtering etch technique that chamfers off the patterned resist corner to achieve a similar result. In such an alternative process, the photoresist layer 75 is formed by a non-chemical sputter etch process, e.g., an RF sputter etch, to result in the rounded profile shown in FIG. 3. The corner edge of the resist layer 75 (FIG. 2) particularly is struck by the high-energy particles of the RF sputter etch to result in the sloping or tapered corner portion 105 of resist profile 110 of resulting resist layer 75' shown in FIG. 4. The preferred process removes horizontal portions of the photoresist layer 75 and the vertical portions, as shown in FIG. 4, as well as providing the rounded corner profile 105. The sputter etch may be used to increase the resist slope at the corner as depicted in the resulting profile 120 of FIG. 5 which depicts a corner region 115 etched at an angle of 60° or less with respect to the horizontal. This corner slope is sufficient to enable an angled implant to achieve the objects of the invention.

It is understood that any system having a sputter etch mode may be used to practice the invention. As will be appreciated by a person of ordinary skill in the art, the parameters can be varied considerably while still achieving the objects of the invention. For example, the parameters of the sputter etch must be carefully monitored so as not to erode or expose the insulating nitride layer(s) 50, i.e., the nitride corner is not sputter etched. It should further be understood that a combination of sputter-type and spacer-type etch processes may be used to facilitate the reduced size and rounded (or removed) corner profile of the resist layer.

Figure 5:
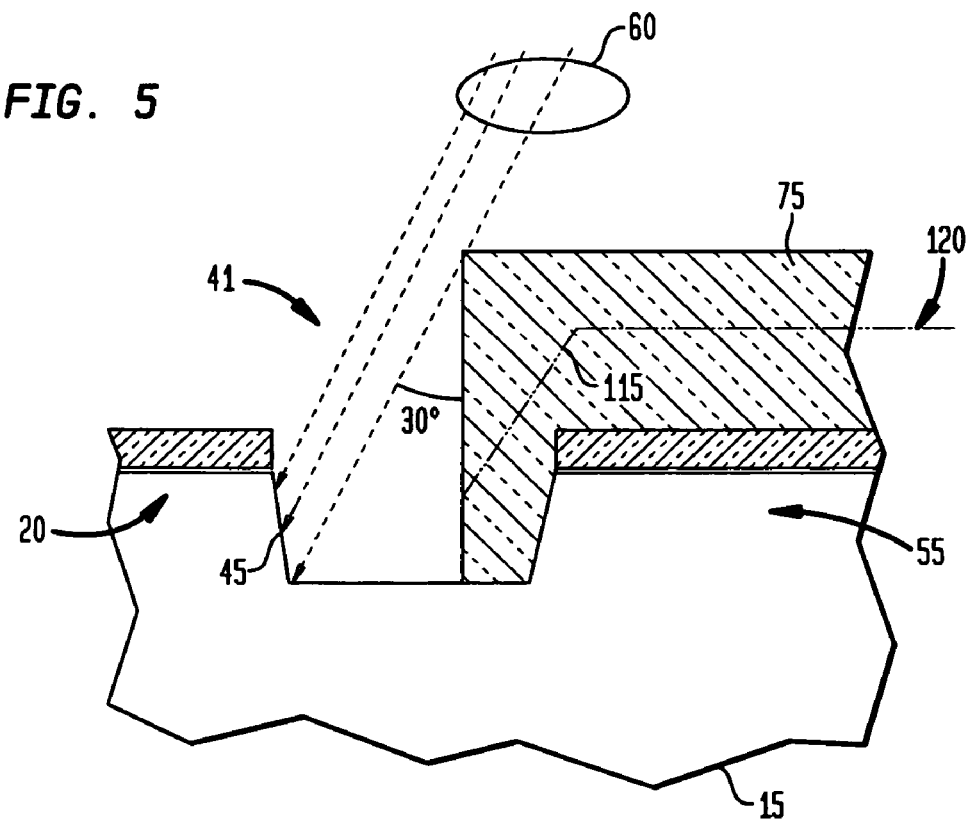

As shown in FIGS. 4 and 5, after performing the respective spacer-type or sputter-type resist etch process, the dopant material 60 is implanted into the STI sidewall 45 at an angle permitted by the reduced/rounded profile of the resist layer. Preferably, the sidewall is doped by ion implantation at suitable energies and concentrations to ensure electrical conductivity from the top of the formed surface pinning layer of the photodiode (collection well) to the underlying lightly-doped substrate. It is understood that the pinning layer and collection well of the photodiode may be formed either before or subsequent to the STI sidewall doping formation, and, prior to filling the STI with the dielectric material. Due to the etch techniques of the patterned photoresist, dopant materials may be implanted with greater control and effectiveness at greater angles than previously achieved.

While there has not been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A method for forming an active pixel sensor (APS) cell structure comprising the steps of:
   a) providing a substrate of a first conductivity type;
   b) forming a trench isolation proximate the location of an adjacent photosensitive device having a surface pinning layer of said first conductivity type;
   c) forming a photoresist layer patterned atop a substrate surface to expose a sidewall portion of said isolation trench;
   d) tailoring the size of said patterned photoresist layer to facilitate ion implanting of dopant material in said exposed sidewall portion; and,
   e) forming a dopant region comprising implanted dopant material of the first conductivity type along said exposed isolation trench sidewall portion adapted for electrically coupling a formed pinning layer to the substrate.

2. The method as claimed in claim 1, wherein said step d) of tailoring the size of said patterned photoresist layer comprises the step of reducing a size of said photoresist layer pattern by performing a resist etch process.

3. The method as claimed in claim 2, wherein said resist etch process comprises a chemical-type etch having lateral etch and vertical etch components.

4. The method as claimed in claim 3, wherein said chemical-type etch is adapted to provide rounding of a corner portion of said patterned resist layer above an edge of said gate region thereby facilitating the ion implanting of dopant material to form the dopant region.

5. The method as claimed in claim 2, wherein said resist etch process comprises a sputter-type etch process.

6. The method as claimed in claim 5, wherein said sputter-type etch utilizes a directional plasma.

7. The method as claimed in claim 5, wherein said sputter-type etch process is adapted to chamfer a corner portion of said patterned resist layer thereby facilitating the ion implanting of dopant material to form the dopant region.

8. The method as claimed in claim 7, wherein said chamfered corner portion of said patterned resist layer enables ion implanting of dopant material at a reduced angle with respect to the horizontal.

9. The method as claimed in claim 1, further comprising the steps of:

forming a transfer gate region comprising a dielectric layer formed on the substrate and a gate conductor formed on the gate dielectric layer;

forming said adjacent photosensitive device including a collection well layer of a second conductivity type adjacent a first side of said gate region and below a substrate surface; and, forming said surface pinning layer of said first conductivity type formed atop the collection well layer at said substrate surface.

10. The method as claimed in claim 9, further comprising the step of forming a diffusion region of a second conductivity type formed adjacent a second side of said transfer gate region, said gate conductor forming a channel region enabling charge transfer between said collection well layer and said diffusion region.

* * * * *